United States Patent
Jung et al.

(10) Patent No.: US 12,091,636 B2
(45) Date of Patent: Sep. 17, 2024

(54) COMPOSITION FOR DISSOLVING ABRASIVE PARTICLES AND CLEANING METHOD USING THE SAME

(71) Applicant: KCTECH CO., LTD., Anseong-si (KR)

(72) Inventors: Kyong Jin Jung, Gyeonggi-do (KR); Ga Young Jung, Gyeonggi-do (KR); Young Ho Yun, Anseong-si (KR); Kun Hee Park, Gyeonggi-do (KR); Young Gon Kim, Anseong-si (KR); Yong Ho Jeong, Gyeonggi-do (KR)

(73) Assignee: KCTECH CO., LTD., Gyeonggi-do (KR)

( * ) Notice: Subject to any disclaimer, the term of this patent is extended or adjusted under 35 U.S.C. 154(b) by 424 days.

(21) Appl. No.: 17/516,668

(22) Filed: Nov. 1, 2021

(65) Prior Publication Data

US 2022/0145216 A1    May 12, 2022

(30) Foreign Application Priority Data

Nov. 6, 2020 (KR) .................. 10-2020-0147813

(51) Int. Cl.
| | |
|---|---|
| *C11D 1/00* | (2006.01) |
| *C09G 1/02* | (2006.01) |
| *C09K 3/14* | (2006.01) |
| *C11D 1/14* | (2006.01) |
| *H01L 21/304* | (2006.01) |

(52) U.S. Cl.
CPC ............... *C11D 1/143* (2013.01); *C09G 1/02* (2013.01); *C09K 3/1409* (2013.01); *C11D 1/004* (2013.01); *C11D 2111/22* (2024.01); *H01L 21/304* (2013.01)

(58) Field of Classification Search
CPC ................................ C11D 1/143; C11D 1/004
See application file for complete search history.

(56) References Cited

U.S. PATENT DOCUMENTS

| | | | |
|---|---|---|---|
| 2008/0039356 | A1 | 2/2008 | Palmer et al. |
| 2016/0315019 | A1 | 10/2016 | Oh et al. |

FOREIGN PATENT DOCUMENTS

| | | | |
|---|---|---|---|
| CN | 101000469 | 7/2007 | |
| CN | 101531950 | 9/2009 | |
| CN | 101622695 | 1/2010 | |
| CN | 107406810 | 11/2017 | |
| CN | 110462795 | 11/2019 | |
| CN | 111465679 | 7/2020 | |
| KR | 20160109645 | 9/2016 | |
| KR | 20160112401 | 9/2016 | |
| TW | 202037719 | 10/2020 | |
| WO | WO-2013118013 A1 * | 8/2013 | ............. C11D 1/662 |

* cited by examiner

Primary Examiner — Necholus Ogden, Jr.
(74) Attorney, Agent, or Firm — JCIPRNET

(57) ABSTRACT

A composition for dissolving abrasive particles, and a cleaning method using the composition are provided. The composition includes a sulfur-containing organic acid, a fluorine ion-containing compound, and a solvent, and a turbidity change rate (%) measured at 60° C. for 15 minutes may be in a range of −80 to −99.

11 Claims, No Drawings

COMPOSITION FOR DISSOLVING ABRASIVE PARTICLES AND CLEANING METHOD USING THE SAME

CROSS-REFERENCE TO RELATED APPLICATION

This application claims the benefit of Korean Patent Application No. 10-2020-0147813 filed on Nov. 6, 2020, in the Korean Intellectual Property Office, the entire disclosure of which is incorporated herein by reference for all purposes.

BACKGROUND

1. Field of the Invention

One or more example embodiments relate to a composition for dissolving abrasive particles and a cleaning method using the composition, and more particularly, to a composition for dissolving abrasive particles that may be applied as a cleaning solution for cleaning a substrate after chemical mechanical polishing (CMP) and a cleaning method using the composition.

2. Description of the Related Art

Chemical mechanical polishing (CMP) is a process in which an arbitrary material is removed from a surface of a semiconductor device and in which the surface is polished by a physical process such as polishing and a chemical process such as oxidation or chelation. In its most rudimentary form, CMP involves applying a CMP slurry, for example, a solution of an active compound and abrasive particles, to a polishing pad that buffs a surface of a semiconductor wafer to achieve removal, planarization, and polishing processes. Abrasive particles contained in a CMP slurry solution tend to aggregate with each other during polishing of a wafer in a CMP process. Due to such aggregation of the abrasive particles, a large number of particles having a size of a few micrometers (μm) or greater may remain on the wafer even though the CMP process is completed, and defects such as scratches on the surface of the wafer may be caused by the above particles during subsequent processing. Accordingly, there is a need for a cleaning process to remove contaminants such as aggregated particles from the surface of the wafer after the CMP process is performed.

After a polishing process is performed using abrasive particles such as a silica slurry or a ceria slurry, a cleaning process is required to remove polishing debris, abrasive particles, organic residues, or by-products, remaining on a surface of a substrate. Requirements for development of a new cleaning process and equipment for next-generation semiconductor process technologies are increasing.

A cleaning process for cleaning a semiconductor wafer on which the CMP process is performed may include a cleaning method using scrubbing with a brush and a chemical cleaning method using a cleaning solution. Scrubbing with a brush is performed to remove contaminants adsorbed on the wafer, for example, CMP slurries and CMP residues, so as to mechanically remove the adsorbed contaminants using the brush while spraying deionized water (DI) water on the wafer. However, if only a mechanical method using a brush is used, contaminants such as CMP slurries and CMP residues may not be completely removed and may often remain. Accordingly, it is difficult to perform a subsequent process. After the CMP process, it is necessary to completely remove contaminants remaining on the wafer by an additional cleaning process using a cleaning solution formed of a chemical material, and then a subsequent process is performed.

In a cleaning process using a cleaning solution, liquid phase cleaning is effective in removing metal contamination, and treatments with hydrochloric acid/hydrogen peroxide mixture (HPM), sulfuric acid peroxide mixture (SPM), ozone water, diluted hydrogen fluoride (DHF), and the like are generally performed. It is difficult to completely remove metal contamination using the HPM and the SPM, and the DHF is being widely used.

After the CMP process is performed using a ceria CMP slurry, cleaning with hydrofluoric acid is typically performed to remove ceria particles, which are abrasive particles, remaining on the surface of the substrate. Due to an extremely high solubility to a thermal oxide film in the cleaning with hydrofluoric acid, scratches or surface defects may occur, which may have an influence on a process after the cleaning and may cause a decrease in a yield and a quality of a semiconductor device.

SUMMARY

Example embodiments provide a composition for dissolving abrasive particles which includes a sulfur-containing organic acid to dissolve and remove a polishing slurry, abrasive particles, debris derived from abrasive particles, a polishing by-product, and the like remaining after a polishing process, and to minimize defects.

Example embodiments provide a cleaning method using a composition for dissolving abrasive particles after a polishing process.

However, aspects to be achieved in the present disclosure are not limited to the above-described aspects, and other aspects not mentioned herein may be clearly understood by a person having ordinary skill in the art to which the present disclosure pertains from the following description.

According to an aspect, a composition for dissolving abrasive particles includes a sulfur-containing organic acid, a fluorine ion-containing compound, and a solvent, wherein a turbidity change rate (%) measured at 60° C. for 15 minutes is in a range of −80 to −99.

The sulfur-containing organic acid may be included in an amount of 1% by weight (wt %) to 10 wt % in the composition.

The sulfur-containing organic acid may include at least one of sulfenic acid (RSOH), sulfinic acid (RSO(OH)), organic sulfonic acid (RS(=O)$_2$—OH), thiosulfonic acid (RSO$_2$SH), and thiocarboxylic acid (RC(S)OH).

The organic sulfonic acid may include at least one of alkanesulfonic acid, alkanolsulfonic acid, sulfosuccinic acid, and aromatic sulfonic acid.

The fluorine ion-containing compound may be included in an amount of 2 wt % to 10 wt % in the composition.

The fluorine ion-containing compound may be an ionic fluoride compound.

The fluorine ion-containing compound may include at least one of ammonium fluoride, ammonium bifluoride, ammonium tetrafluoroborate, ammonium silicofluoride, aminobenzotrifluoride, tetramethylammonium fluoride, tetraethylammonium fluoride, tetrabutylammonium difluorotriphenylsilicate, tetrabutylammonium fluoride, and benzyltrimethylammonium fluoride.

The composition may further include a sulfur-containing compound including at least one of thiosulfuric acid ($H_2S_2O_3$), sulfuric acid, sulfide, bisulfide (R—S—S—R'), hydrogen sulfide ($H_2S$), sulfur trioxide ($SO_3$), sulfamic acid, mercaptan (R—SH), and sulfonate. The sulfur-containing compound may be included in an amount of 5 wt % to 15 wt % in the composition.

According to an example embodiment, a mass ratio of the sulfur-containing compound:the sulfur-containing organic acid may be in a range of 2:1 to 5:1.

The sulfonate may include at least one of alkyl sulfonate, aryl sulfonate, alkyl aryl sulfonate, alkyl ether sulfonate, polystyrene sulfonate, alkanesulfonate, α-olefin sulfonate, dodecylbenzenesulfonate, and alkylbenzene sulfonate.

The composition may be used to clean a wafer for a semiconductor device including at least one of a silicon nitride film, a silicon oxide film, a polysilicon film, and a silicon film, after polishing of the wafer.

The composition may be used to dissolve abrasive particles remaining after polishing using a chemical mechanical polishing (CMP) slurry containing abrasive particles.

The abrasive particles may include ceria.

According to another aspect, a cleaning method includes cleaning a wafer for a semiconductor device using the composition, after CMP of the wafer.

The wafer may include at least one of a silicon nitride film, a silicon oxide film, a polysilicon film, and a silicon film.

Additional aspects of example embodiments will be set forth in part in the description which follows and, in part, will be apparent from the description, or may be learned by practice of the disclosure.

According to example embodiments, a composition for dissolving abrasive particles may dissolve a polishing slurry, abrasive particles, debris derived from abrasive particles, a polishing by-product, and the like remaining after a polishing process using the polishing slurry, and may effectively remove defects. In addition, according to example embodiments, a composition for dissolving abrasive particles may be used as a cleaning solution to remove and clean polishing contaminants, and in particular, used as a cleaning solution that may be substituted for a sulfuric acid peroxide mixture (SPM).

DETAILED DESCRIPTION

Hereinafter, example embodiments of the present disclosure will be described in detail. When it is determined detailed description related to a related known function or configuration they may make the purpose of the present disclosure unnecessarily ambiguous in describing the present disclosure, the detailed description will be omitted here. In addition, terminologies used herein are defined to appropriately describe the example embodiments and thus may be changed depending on a user, the intent of an operator, or a custom of a field to which the present disclosure pertains. Accordingly, the terminologies must be defined based on the following overall description of the present specification. In the whole specification, when a member is positioned "on" the other member, this not only includes a case that the any member is brought into contact with the other member, but also includes a case that another member exists between two members.

In the whole specification, if a prescribed part "includes" a prescribed component, this means that another component may be further included instead of excluding another component.

Hereinafter, a composition for dissolving abrasive particles and a cleaning method using the composition will be described in detail with reference to example embodiments. However, the present disclosure is not limited to such example embodiments.

According to an example embodiment, a composition for dissolving abrasive particles may include a sulfur-containing organic acid, a fluorine ion-containing compound, and a solvent.

According to an example embodiment, the sulfur-containing organic acid may be an organic acid having sulfur and/or a sulfur-containing functional group in a molecule, and may function as a dissolution activator to dissolve a polishing by-product such as residual polishing liquid, polishing debris, or particles. The sulfur-containing organic acid may be included in an amount of 1% by weight (wt %) to 10 wt % in the composition. When the sulfur-containing organic acid is included in an amount less than the above range, dissolution may not be performed, and when the sulfur-containing organic acid is included in an amount exceeding the above range, a chemical material may be precipitated, or a solubility may decrease.

For example, the sulfur-containing organic acid may include at least one of sulfenic acid (RSOH), sulfinic acid (RSO(OH)), organic sulfonic acid ($RS(=O)_2$—OH), thiosulfonic acid ($RSO_2SH$), thiocarboxylic acid (RC(S)OH), and salts thereof. Here, R may be selected from hydrogen, a substituted or unsubstituted hydrocarbon (for example, an alkyl group having 1 to 20 carbon atoms, a substituted or unsubstituted aryl group having 6 to 30 carbon atoms, and a substituted or unsubstituted aralkyl group (for example, a benzyl group, a phenyl group, a toluene group, a naphthalene group, and the like)), esters, and the like, but is not limited thereto, which will be described in detail below. The "substituted" may indicate a substitution with at least one of a hydroxy group (—OH), halogen, a carboxyl group (—COOH), an alkyl group having 1 to 10 carbon atoms, and an aryl group having 6 to 10 carbon atoms. The salts may be inorganic salts or organic salts, and may include, for example, a sodium salt, a potassium salt, a magnesium salt, or an ammonium salt.

The organic sulfonic acid may include, for example, alkanesulfonic acid, alkanolsulfonic acid, sulfosuccinic acid, aromatic sulfonic acid, and the like. For example, the alkanesulfonic acid may be represented by $CnH_{2n+1}SO_3H$ (for example, n=1 to 20), and may include, for example, methanesulfonic acid, ethanesulfonic acid, 1-propanesulfonic acid, 2-propanesulfonic acid, 1-butanesulfonic acid, 2-butanesulfonic acid, pentanesulfonic acid, and the like.

For example, the alkanolsulfonic acid may be represented by $C_mH_{2m+1}$—CH(OH)—$C_pH_{2p}$—$SO_3H$ (for example, m=0 to 10, and p=1 to 10), and may include, for example, 2-hydroxyethane-1-sulfonic acid (isothionic acid), 2-hydroxypropane-1-sulfonic acid (2-propanolsulfonic acid), 3-hydroxypropane-1-sulfonic acid, 2-hydroxybutane-1-sulfonic acid, 2-hydroxypentane-1-sulfonic acid, 1-hydroxypropane-2-sulfonic acid, 4-hydroxybutane-1-sulfonic acid, 2-hydroxyhexane-1-sulfonic acid, and the like.

The aromatic sulfonic acid may include, for example, benzenesulfonic acid, alkylbenzenesulfonic acid, aminobenzenesulfonic acid, nitrobenzenesulfonic acid, sulfobenzoic acid, hydroxybenzenesulfonic acid, toluenesulfonic acid, phenolsulfonic acid, naphthalenesulfonic acid, alkylnaphthalenesulfonic acid, naphtholsulfonic acid, xylenesulfonic acid, cresolsulfonic acid, sulfosalicylic acid (5-sulfosalicylic acid), polystyrenesulfonic acid, diphenylamine-4-sulfonic acid, and the like. Here, the alkyl group may be selected from 1 to 20 carbon atoms.

For example, the sulfur-containing organic acid may be of two, three or more types. A first compound and a second compound may be included at a ratio (w/w) of 1 to 10:1 to 10, or 1 to 5:1 to 5, or the first compound, the second compound and a third compound may be included at a ratio (w/w) of 1 to 10:1 to 10:1 to 10, or 1 to 5:1 to 5:1 to 5.

According to an example embodiment, the composition may further include a sulfur-containing compound to further activate dissolution of the abrasive particles.

For example, the sulfur-containing compound may be included in an amount of 5 wt 0 to 15 wt % in the composition. When the amount of the sulfur-containing compound is less than 5 wt %, there may be no effect of increasing dissolution activation of abrasive particles. When the amount of the sulfur-containing compound exceeds 15 wt %, a semiconductor substrate may be affected to cause defects, and a solution may be precipitated, or an addition reaction may occur.

The sulfur-containing compound may include, for example, at least one of sulfuric acid, thiosulfuric acid ($H_2S_2O_3$), sulfide, bisulfide (R—S—S—R'), hydrogen sulfide ($H_2S$), sulfur trioxide ($SO_3$), sulfamic acid, mercaptan (R—SH), sulfate, sulfonate (R—$SO_3^-$, R—$SO_3$—R'), salts thereof, and anhydrides thereof. Here, R and R' may be selected from hydrogen, a substituted or unsubstituted hydrocarbon (for example, an alkyl group having 1 to 20 carbon atoms, a substituted or unsubstituted aryl group having 6 to 30 carbon atoms, and a substituted or unsubstituted aralkyl group (for example, a benzyl group, a phenyl group, a toluene group, a naphthalene group, and the like)), esters, and the like, but are not limited thereto, which will be described in detail below. The "substituted" may indicate a substitution with at least one of a hydroxy group (—OH), a carboxyl group (—COOH), an alkyl group having 1 to 10 carbon atoms, and an aryl group having 6 to 10 carbon atoms. The salts may be inorganic salts or organic salts, and may include, for example, a sodium salt, a potassium salt, a magnesium salt, or an ammonium salt.

For example, the sulfonate may be a salt or ester of the sulfonic acid, and may include, for example, alkyl sulfonate, aryl sulfonate, alkyl aryl sulfonate, alkyl ether sulfonate, polystyrene sulfonate, alkanesulfonate, α-olefin sulfonate, dodecylbenzenesulfonate, alkylbenzene sulfonate, and the like. Here, the alkyl group and alkane may be selected from 1 to 20 carbon atoms, and the aryl group may be selected from 6 to 30 carbon atoms.

For example, the sulfur-containing compound may be of two or more types. A first compound and a second compound may be included at a ratio (w/w) of 1 to 10:1 to 10, or 1 to 5:1 to 5, or the first compound, the second compound and a third compound may be included at a ratio (w/w) of 1 to 10:1 to 10:1 to 10, or 1 to 5:1 to 5:1 to 5.

According to an example embodiment, the fluorine ion-containing compound may function as an etchant and a reduction catalyst to assist in dissolving abrasive particles, by-products derived from the abrasive particles, and the like, remaining after the polishing process in water in the form of hydrates.

For example, the fluorine ion-containing compound may be included in an amount of 2 wt % to 10 wt % in the composition. When the amount of the fluorine ion-containing compound is less than 2 wt %, a hydrate may not be generated, and when the amount of the fluorine ion-containing compound exceeds 10 wt %, a semiconductor substrate may be affected to cause defects.

For example, the fluorine ion-containing compound may be an ionic fluoride compound. The fluorine ion-containing compound may include, for example, at least one of ammonium fluoride, ammonium bifluoride, ammonium tetrafluoroborate, ammonium silicofluoride, aminobenzotrifluoride, tetramethylammonium fluoride, tetraethylammonium fluoride, tetrabutylammonium difluorotriphenylsilicate, tetrabutylammonium fluoride, and benzyltrimethylammonium fluoride.

For example, a mass ratio of the sulfur-containing compound:the sulfur-containing organic acid may be in a range of 2:1 to 5:1. For example, a mass ratio (w/w) of the sulfur-containing organic acid:the fluorine ion-containing compound may be in a range of 1:1 to 1:15. In other words, when the sulfur-containing organic acid and the fluorine ion-containing compound are included within the above range of the mass ratio, excellent solubility for abrasive particles and by-products thereof may be obtained, and a damage to the semiconductor substrate may be minimized.

According to an example embodiment, the solvent may include water and/or an organic solvent. The solvent in the composition may function to dissolve and/or disperse the other components in the composition. Desirably, the solvent may not contain impurities that inhibit actions of the other components, as much as possible. Specifically, the solvent may include ion-exchanged water, from which foreign materials are removed through a filter after removing impurity ions using an ion-exchange resin, pure water, ultrapure water, deionized water, or distilled water.

For example, pH of the composition may be in a range of 2 to 7. When the pH is in the above pH range, and when a substrate on which CMP is performed, for example, a wafer for a semiconductor device is treated with the composition, contaminants such as remaining impurities, organic materials, abrasive particles, and the like may be sufficiently removed in a cleaning process, thereby minimizing defects.

For example, dissolution and removal performance of the composition with respect to abrasive particles, debris derived from the abrasive particles, and a polishing by-product may be confirmed based on a change in turbidity. For example, a turbidity change rate (%), which is measured for 15 minutes in a mixed solution containing the composition and any one or any combination of the abrasive particles, the debris derived from the abrasive particles, and the polishing by-product at a temperature of room temperature (rt) to 80° C., a temperature of 50° C. to 70° C., or about 60° C., may be in a range of −80 to −99.

According to an example embodiment, the composition may be applied to cleaning of a substrate having a surface on which abrasive particles and foreign materials derived from the abrasive particles adhere and/or remain after a CMP process. The substrate may be, for example, a substrate for a semiconductor device such as a silicon substrate, a sapphire substrate, a quartz substrate, a glass substrate, a ceramic substrate, and the like.

For example, the wafer for the semiconductor device may include at least one film among a silicon nitride film, a silicon oxide film, a polysilicon film, and a silicon film, and the film may be used as a target film to be polished, or a polishing stop film in a polishing process.

For example, the composition may be used to remove defects, residues, and contaminants from a polished surface of the wafer for the semiconductor device, and may be used to dissolve and/or remove polishing residues (for example, abrasive particles, and foreign materials derived from the abrasive particles) after the CMP process.

The residues may include, for example, abrasive particles of a CMP slurry, a material derived from abrasive particles, a chemical material present in the CMP slurry, a by-product of the CMP slurry, carbon-rich particles, polishing pad particles, brush deloading particles, equipment materials, a metal, a metal oxide, and the like. For example, the composition may be used to dissolve and/or remove abrasive particles of a CMP slurry and/or particles and/or debris derived from abrasive particles.

For example, the abrasive particles of the CMP slurry may include at least one of a metal oxide, a metal oxide coated with an organic material or inorganic material, and the metal oxide in a colloidal phase. The metal oxide may include at least one of silica, ceria, zirconia, alumina, titania, barium titania, germania, mangania and magnesia, and may desirably be ceria.

For example, the abrasive particles may include particles with a single size of 10 nanometers (nm) to 200 nm, and mixed particles with at least two different sizes of 10 nm to 200 nm.

According to an example embodiment, a cleaning method using a composition for dissolving abrasive particles may be provided. The cleaning method may include cleaning a wafer for a semiconductor device using a composition for dissolving abrasive particles, after CMP of the wafer.

Hereinafter, the present disclosure will be described in detail with reference to the following examples and comparative examples. However, the technical idea of the present disclosure is not limited or restricted thereto.

Example 1

A composition including 1 wt % to 10 wt % of methanesulfonic acid, and 2 wt % to 10 wt % of ammonium fluoride was prepared.

Example 2

A composition including 1 wt % to 10 wt % of methanesulfonic acid (containing 10 times that of Example 1) and 2 wt % to 10 wt % of ammonium fluoride was prepared.

Example 3

A composition including 1 wt % to 10 wt % of p-toluenesulfonic acid, and 2 wt % to 10 wt % of ammonium fluoride was prepared.

Example 4

A composition including 1 wt % to 10 wt % of p-toluenesulfonic acid (containing 10 times that of Example 3) and 2 wt % to 10 wt % of ammonium fluoride was prepared.

Example 5

A composition including 1 wt % to 10 wt % of methanesulfonic acid, 5 wt % to 15 wt % of sulfamic acid, and 2 wt % to 10 wt % of ammonium fluoride was prepared.

Example 6

A composition including 1 wt % to 10 wt % of methanesulfonic acid and 5-sulfosalicylic acid, 5 wt % to 15 wt % of sulfamic acid (methanesulfonic acid: 5-sulfosalicylic acid:sulfamic acid=1:1:3 (w/w)), and 2 wt % to 10 wt % of ammonium fluoride was prepared.

Example 7

A composition including 1 wt % to 10 wt % of methanesulfonic acid, 5 wt % to 15 wt % of sulfamic acid (methanesulfonic acid:sulfamic acid=1:2 (w/w)), and 2 wt % to 10 wt % of ammonium fluoride was prepared.

Example 8

A composition including 1 wt % to 10 wt % of polystyrene sulfonic acid, 5 wt % to 15 wt % of sulfamic acid, and 2 wt % to 10 wt % of ammonium fluoride was prepared.

Example 9

A composition including 1 wt % to 10 wt % of methanesulfonic acid, 5 wt % to 15 wt % of sulfuric acid, and 2 wt % to 10 wt % of ammonium fluoride was prepared.

Example 10

A composition including 1 wt % to 10 wt % of methanesulfonic acid (containing six times that of Example 7), 5 wt % to 15 wt % of sulfamic acid, and 2 wt % to 10 wt % of ammonium fluoride was prepared.

Example 11

A composition including 1 wt % to 10 wt % of methanesulfonic acid, 5 wt % to 15 wt % of sulfamic acid, and 2 wt % to 10 wt % of ammonium fluoride (containing 1.1 to 1.5 times that of Example 7) was prepared.

Example 12

A composition including 1 wt % to 10 wt % of ethanesulfonic acid, 5 wt % to 15 wt % of sulfamic acid, and 2 wt % to 10 wt % of ammonium fluoride was prepared.

Example 13

A composition including 1 wt % to 10 wt % of benzenesulfonic acid, 5 wt % to 15 wt % of sulfamic acid, and 2 wt % to 10 wt % of ammonium fluoride was prepared.

Example 14

A composition including 1 wt % to 10 wt % of methanesulfonic acid and 5-sulfosalicylic acid (MSA:SSA=1:1 (w/w), and 2 wt % to 10 wt % of ammonium fluoride was prepared.

Example 15

A composition including 1 wt % to 10 wt % of methanesulfonic acid, 5 wt % to 15 wt % of sulfamic acid, and 1 wt % to 10 wt % of ammonium fluoride was prepared.

Example 16

A composition including 1 wt % to 10 wt % of methanesulfonic acid, 5 wt % to 15 wt % of sulfamic acid, and 2 wt % to 10 wt % of ammonium fluoride (containing five times that of Example 15) was prepared.

Example 17

A composition including 1 wt % to 10 wt % of methanesulfonic acid, 5 wt % to 15 wt % of sulfamic acid, and 2 wt % to 10 wt % of ammonium fluoride (containing seven times that of Example 15) was prepared.

Example 18

A composition including 1 wt % to 10 wt % of 5-sulfosalicylic acid, 5 wt % to 15 wt % of sulfamic acid, and 2 wt % to 10 wt % of ammonium fluoride was prepared.

Comparative Example 1

The composition was a commercially available sulfuric acid peroxide mixture (SPM) as a cleaning solution.

Comparative Example 2

The composition was a cleaning solution containing phosphoric acid and hydrogen peroxide (3:1 (w/w), based on wt %).

Comparative Example 3

A composition including 0.1 wt % to 10 wt % of methanesulfonic acid and 5 wt % to 20 wt % of sulfuric acid was prepared.

*In Examples 1 to 18 and Comparative Examples 1 to 3, a solvent is a residual amount or an appropriate amount of deionized water.

TABLE 1

| | Composition | | |
|---|---|---|---|
| | Sulfur-containing organic acid | Sulfur-containing compound | Fluorine ion-containing compound |
| Comp. Ex. 1 | SPM | | |
| Comp. Ex. 2 | Phosphoric acid, hydrogen peroxide (3:1 w/w) | | |
| Comp. Ex. 3 | Methanesulfonic acid | Sulfuric acid | |

TABLE 1-continued

| | Composition | | |
|---|---|---|---|
| | Sulfur-containing organic acid | Sulfur-containing compound | Fluorine ion-containing compound |
| Ex. 1 | Methanesulfonic acid | — | Ammonium fluoride |
| Ex. 2 | Methanesulfonic acid | — | Ammonium fluoride |
| Ex. 3 | p-toluenesulfonic acid | — | Ammonium fluoride |
| Ex. 4 | p-toluenesulfonic acid | — | Ammonium fluoride |
| Ex. 5 | Methanesulfonic acid | Sulfamic acid | Ammonium fluoride |
| Ex. 6 | Methanesulfonic acid + 5-sulfosalicylic acid (1:1 w/w) | Sulfamic acid | Ammonium fluoride |
| Ex. 7 | Methanesulfonic acid | Sulfamic acid | Ammonium fluoride |
| Ex. 8 | Polystyrene sulfonic acid | Sulfamic acid | Ammonium fluoride |
| Ex. 9 | Methanesulfonic acid | Sulfuric acid | Ammonium fluoride |
| Ex. 10 | Methanesulfonic acid | Sulfamic acid | Ammonium fluoride |
| Ex. 11 | Methanesulfonic acid | Sulfamic acid | Ammonium fluoride |
| Ex. 12 | Ethanesulfonic acid | Sulfamic acid | Ammonium fluoride |
| Ex. 13 | Benzenesulfonic acid | Sulfamic acid | Ammonium fluoride |
| Ex. 14 | Methanesulfonic acid + 5-sulfosalicylic acid (1:1 w/w) | — | Ammonium fluoride |
| Ex. 15 | Methanesulfonic acid | Sulfamic acid | Ammonium fluoride |
| Ex. 16 | Methanesulfonic acid | Sulfamic acid | Ammonium fluoride |
| Ex. 17 | Methanesulfonic acid | Sulfamic acid | Ammonium fluoride |
| Ex. 18 | 5-sulfosalicylic acid | Sulfamic acid | Ammonium fluoride |

Observation of Change in Turbidity (in Nephelometric Turbidity Units (NTU)_%) To verify dissolution performance of ceria particles of the compositions prepared in Examples 1 to 18 and Comparative Examples 1 to 3, each of the compositions was added to a solution containing 0.01 wt % of a ceria slurry and stirring was performed at room temperature, 60° C., and 80° C., respectively, for a period of 1 m to 15 m. A change in turbidity was observed using turbidity change evaluation equipment (HACH 2100Q). The results thereof are shown in Table 2. A criterion for the change in the turbidity is the solution (turbidity: "169") containing 0.01 wt 0% of the ceria slurry.

TABLE 2

Change in Turbidity (NTU_%)
*Reduction rate: Ref. 169 criterion

| | | Time (min) | | | | | | | | |
|---|---|---|---|---|---|---|---|---|---|---|
| No. | Temperature (° C.) | 1 (min) | Reduction rate (%) | 3 (min) | Reduction rate (%) | 5 (min) | Reduction rate (%) | 10 (min) | Reduction rate (%) | 15 (min) | Reduction rate (%) |
| Comp. Ex. 1 | RT | 370 | 118.9% | 415 | 145.6% | 474 | 180.5% | 493 | 191.7% | 509 | 201.2% |
| | 60 | 280 | 65.7% | 204 | 20.7% | 133 | −21.3% | 40.1 | −76.3% | 38.2 | −77.4% |
| | 80 | | | | | | | | | 0.6 | −99.6% |
| Comp. Ex. 2 | RT | | | | | | | | | | |
| | 80 | | | | | | | | | 37 | −78.1% |
| Comp. Ex. 3 | RT | | | | | | | | | 168 | −0.6% |
| | 60 | | | | | | | | | | |
| Ex. 1 | RT | 273 | 60.5% | 258 | 52.4% | 248 | 46.4% | 239 | 40.8% | 236 | 39.1% |
| | 60 | 257 | 51.0% | 217 | 28.1% | 187 | 10.3% | 139 | −18.3% | 114 | −33.1% |
| Ex. 2 | RT | 265 | 55.7% | 266 | 57.1% | 244 | 44.0% | 227 | 33.7% | 231 | 36.1% |
| | 60 | 227 | 33.2% | 179 | 5.6% | 148 | −12.8% | 41.2 | −76.2% | 6.94 | −96.5% |
| Ex. 3 | RT | 280 | 64.6% | 279 | 64.8% | 259 | 52.9% | 247 | 45.6% | 237 | 39.6% |
| | 60 | 266 | 56.3% | 227 | 34.0% | 196 | 15.6% | 150 | −11.8% | 121 | −29.0% |
| Ex. 4 | RT | 281 | 65.2% | 275 | 62.4% | 268 | 58.2% | 263 | 55.0% | 265 | 56.2% |
| | 60 | 221 | 29.7% | 165 | −2.7% | 140 | −17.6% | 78.5 | −54.1% | 33.2 | −80.9% |
| Ex. 5 | RT | 277 | 62.8% | 255 | 50.6% | 254 | 49.9% | 239 | 40.8% | 255 | 50.3% |
| | 60 | 261 | 53.4% | 210 | 24.0% | 176 | 3.8% | 117 | −31.4% | 65.7 | −61.7% |
| Ex. 6 | RT | 281 | 65.2% | 257 | 51.8% | 252 | 48.7% | 241 | 42.0% | 237 | 39.6% |
| | 60 | 229 | 34.4% | 179 | 5.6% | 139 | −18.1% | 40.2 | −76.8% | 8.47 | −95.6% |
| Ex. 7 | RT | 282 | 65.8% | 262 | 54.7% | 242 | 42.8% | 217 | 27.8% | 224 | 32.0% |
| | 60 | 232 | 36.2% | 172 | 1.5% | 133 | −21.7% | 72.8 | −57.5% | 22.9 | −87.0% |
| Ex. 8 | RT | 268 | 57.5% | 253 | 49.4% | 254 | 49.9% | 241 | 42.0% | 228 | 34.3% |
| | 60 | 217 | 27.3% | 187 | 10.4% | 172 | 1.4% | 153 | −10.1% | 144 | −15.4% |

TABLE 2-continued

Change in Turbidity (NTU_%)
*Reduction rate: Ref. 169 criterion

| No. | Temperature (° C.) | 1 (min) | Reduction rate (%) | 3 (min) | Reduction rate (%) | 5 (min) | Reduction rate (%) | 10 (min) | Reduction rate (%) | 15 (min) | Reduction rate (%) |
|---|---|---|---|---|---|---|---|---|---|---|---|
| Ex. 9 | RT | 239 | 40.3% | 252 | 48.8% | 235 | 38.7% | 219 | 29.0% | 212 | 24.9% |
|  | 60 | 216 | 26.7% | 163 | −3.8% | 135 | −20.5% | 46.4 | −73.1% | 11.4 | −93.8% |
| Ex. 10 | RT | 274 | 61.0% | 249 | 47.0% | 249 | 46.9% | 244 | 43.8% | 230 | 35.5% |
|  | 60 | 258 | 51.6% | 210 | 24.0% | 178 | 4.9% | 44.8 | −74.1% | 8.04 | −95.8% |
| Ex. 11 | RT | 265 | 55.7% | 249 | 47.0% | 236 | 39.3% | 205 | 20.7% | 213 | 25.4% |
|  | 60 | 218 | 27.9% | 153 | −9.8% | 122 | −28.2% | 65 | −62.1% | 21.8 | −87.7% |
| Ex. 12 | RT | 268 | 57.5% | 241 | 42.3% | 217 | 28.0% | 182 | 7.1% | 175 | 3.0% |
|  | 60 | 218 | 27.9% | 139 | −18.0% | 94.6 | −44.4% | 47.8 | −72.3% | 17.1 | −90.5% |
| Ex. 13 | RT | 276 | 62.2% | 253 | 49.4% | 240 | 41.6% | 238 | 40.2% | 234 | 37.9% |
|  | 60 | 233 | 36.8% | 176 | 3.9% | 140 | −17.6% | 69.9 | −59.2% | 20.1 | −88.7% |
| Ex. 14 | RT | 272 | 59.9% | 268 | 58.3% | 245 | 44.6% | 229 | 34.9% | 219 | 29.0% |
|  | 60 | 227 | 33.2% | 176 | 3.9% | 130 | −23.5% | 27.9 | −84.1% | 5.2 | −97.5% |
| Ex. 15 | RT | 275 | 61.6% | 303 | 79.0% | 287 | 69.4% | 266 | 56.8% | 257 | 51.5% |
|  | 60 | 273 | 60.5% | 234 | 38.2% | 227 | 33.9% | 245 | 44.4% | 252 | 48.5% |
| Ex. 16 | RT | 269 | 58.1% | 247 | 45.9% | 221 | 30.4% | 182 | 7.1% | 138 | −18.9% |
|  | 60 | 204 | 19.6% | 130 | −23.4% | 86.8 | −49.0% | 41.2 | −76.2% | 24 | −86.4% |
| Ex. 17 | RT | 274 | 61.0% | 243 | 43.5% | 229 | 35.1% | 202 | 18.9% | 204 | 20.1% |
|  | 60 | 197 | 15.5% | 136 | −19.8% | 91 | −46.5% | 11.5 | −93.8% | 2.23 | −99.3% |
| Ex. 18 | RT | 260 | 53.8% | 240 | 42.0% | 222 | 31.4% | 198 | 17.2% | 189 | 11.8% |
|  | 60 | 211 | 24.9% | 157 | −7.1% | 116 | −31.4% | 28.1 | −83.4% | 4.47 | −97.4% |

Referring to Table 2, it may be confirmed that the composition according to the present disclosure is excellent in dissolution performance for ceria particles in a process of dissolving ceria particles, based on the change in the turbidity. In addition, it may be confirmed that the dissolution performance for the ceria particles is superior to that of an SPM used in a cleaning process after a CMP process of a substrate of a semiconductor device. Thus, the composition may be applicable to cleaning with an SPM in the cleaning process after the CMP process, or may be used as a cleaning solution that may be substituted for an SPM. Furthermore, considering dissolution and removal performance for ceria particles shown in Table 2, the composition may be expected to be used to remove abrasive particles and by-products derived from the abrasive particles, residues of the CMP process, and the like, during cleaning using a brush module in the cleaning process after the CMP process.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A composition for dissolving abrasive particles, the composition comprising:
   a sulfur-containing organic acid;
   a fluorine ion-containing compound;
   a solvent; and
   a sulfur-containing compound,
   wherein a turbidity change rate (%) measured at 60° C. for 15 minutes is in a range of −80 to −99,
   wherein the sulfur-containing organic acid comprises at least one selected from a group consisting of sulfenic acid (RSOH), sulfinic acid (RSO(OH)), organic sulfonic acid (RS($=$O)$_2$—OH), thiosulfonic acid (RSO$_2$SH), and thiocarboxylic acid (RC(S)OH), and
   wherein the sulfur-containing compound comprises at least one selected from a group consisting of thiosulfuric acid (H$_2$S$_2$O$_3$), sulfuric acid, sulfide, bisulfide (R—S—S—R'), hydrogen sulfide (H$_2$S), sulfur trioxide (SO$_3$), sulfamic acid, mercaptan (R—SH), and sulfonate, and
   wherein the sulfur-containing compound is included in an amount of 5 wt % to 15 wt % in the composition, and
   wherein a mass ratio of the sulfur-containing compound : the sulfur-containing organic acid is in a range of 2:1 to 5:1, and
   wherein the composition is used to dissolve abrasive particles remaining after polishing using a chemical mechanical polishing (CMP) slurry containing abrasive particles.

2. The composition of claim 1, wherein the sulfur-containing organic acid is included in an amount of 1% by weight (wt %) to 10 wt % in the composition.

3. The composition of claim 1, wherein the organic sulfonic acid comprises at least one selected from a group consisting of alkanesulfonic acid, alkanolsulfonic acid, sulfosuccinic acid, and aromatic sulfonic acid.

4. The composition of claim 1, wherein the fluorine ion-containing compound is included in an amount of 2 wt % to 10 wt % in the composition.

5. The composition of claim 1, wherein the fluorine ion-containing compound is an ionic fluoride compound.

6. The composition of claim 1, wherein the fluorine ion-containing compound comprises at least one selected from a group consisting of ammonium fluoride, ammonium bifluoride, ammonium tetrafluoroborate, ammonium silicofluoride, aminobenzotrifluoride, tetramethylammonium fluoride, tetraethylammonium fluoride, tetrabutylammonium difluorotriphenylsilicate, tetrabutylammonium fluoride, and benzyltrimethylammonium fluoride.

7. The composition of claim 1, wherein the sulfonate comprises at least one selected from a group consisting of alkyl sulfonate, aryl sulfonate, alkyl aryl sulfonate, alkyl ether sulfonate, polystyrene sulfonate, alkanesulfonate, α-olefin sulfonate, dodecylbenzenesulfonate, and alkylbenzene sulfonate.

8. The composition of claim 1, wherein the composition is used to clean a wafer for a semiconductor device comprising at least one film selected from a group consisting of a silicon nitride film, a silicon oxide film, a polysilicon film, and a silicon film, after polishing of the wafer.

9. The composition of claim 1, wherein the abrasive particles comprise ceria.

10. A cleaning method comprising:
    cleaning a wafer for a semiconductor device using the composition of claim 1, after chemical mechanical polishing (CMP) of the wafer.

11. The cleaning method of claim 10, wherein the wafer comprises at least one film selected from a group consisting of a silicon nitride film, a silicon oxide film, a polysilicon film, and a silicon film.

\* \* \* \* \*